(12) United States Patent
Cha et al.

(10) Patent No.: US 8,760,049 B2
(45) Date of Patent: Jun. 24, 2014

(54) LIGHT SOURCE MODULE AND METHOD OF MANUFACTURING THE SAME

(75) Inventors: Han-Moe Cha, Anyang-si (KR); Ju-Young Yoon, Seoul (KR); Jin Seo, Osan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 196 days.

(21) Appl. No.: 13/198,148

(22) Filed: Aug. 4, 2011

(65) Prior Publication Data

US 2012/0195020 A1  Aug. 2, 2012

(30) Foreign Application Priority Data

Jan. 28, 2011  (KR) .............................. 2011-0008563

(51) Int. Cl.
*H05B 33/00* (2006.01)
*H01J 1/62* (2006.01)

(52) U.S. Cl.
USPC ........................................... 313/512; 445/23

(58) Field of Classification Search
USPC ...................... 313/485, 512; 362/800; 257/89
See application file for complete search history.

(56) References Cited

U.S. PATENT DOCUMENTS

| | | | | |
|---|---|---|---|---|
| 7,821,194 B2* | 10/2010 | Negley et al. | ................. | 313/498 |
| 8,324,654 B2* | 12/2012 | An et al. | .......................... | 257/99 |
| 2006/0245188 A1* | 11/2006 | Takenaka | ...................... | 362/231 |
| 2009/0108271 A1* | 4/2009 | Chou et al. | ....................... | 257/88 |
| 2010/0090231 A1* | 4/2010 | Jung et al. | ....................... | 257/89 |
| 2010/0157583 A1* | 6/2010 | Nakajima | ..................... | 362/184 |

FOREIGN PATENT DOCUMENTS

| | | |
|---|---|---|
| JP | 2007-150233 | 6/2007 |
| JP | 2010-109170 | 5/2010 |
| KR | 0961342 | 5/2010 |

* cited by examiner

*Primary Examiner* — Joseph L Williams
(74) *Attorney, Agent, or Firm* — F. Chau & Associates, LLC (57) ABSTRACT

A light source module includes a receiving container, a first light source, a second light source, a first resin, and a second resin. The receiving container includes an upper surface, a first bottom surface, and a second bottom surface. The first bottom surface has a first depth from the upper surface. The second bottom surface has a second depth from the upper surface. The first light source is disposed on the first bottom surface. The first light source generates first color light. The second light source is disposed on the second bottom surface. The second light source generates second color light. The first resin is formed on the first light source. The first resin includes a phosphor emitting third color light. The second resin is formed on the first resin and the second light source.

18 Claims, 9 Drawing Sheets

LIGHT SOURCE MODULE AND METHOD OF MANUFACTURING THE SAME

CROSS-REFERENCE TO RELATED APPLICATION

This application claims priority to Korean Patent Application No. 2011-8563, filed on Jan. 28, 2011, and all the benefits accruing therefrom under 35 U.S.C. §119, the contents of which are herein incorporated by reference in their entirety.

BACKGROUND

1. Technical Field

Exemplary embodiments of the present invention relate to a light source module and a method of manufacturing the light source module. More particularly, exemplary embodiments of the present invention relate to a light source module with improved light emitting efficiency and a method of manufacturing the light source module.

2. Discussion of the Related Art

Due to thin thickness, light weight, and low power consumption, liquid crystal display apparatuses have been used for monitors, laptop computers, cellular phones, televisions, and so on. A liquid crystal display apparatus includes a liquid crystal display panel that displays images by adjusting light transmittance of liquid crystal molecules, and a backlight assembly disposed under the liquid crystal display panel to provide light to the liquid crystal display panel.

The backlight assembly includes a plurality of light sources that generate light. For example, the light sources may include cold cathode fluorescent lamps ("CCFLs"), external electrode fluorescent lamps ("EEFLs"), flat fluorescent lamps ("FFLs"), and light emitting diodes ("LEDs"), etc.

LEDs consume low power and are eco-friendly. For example, an LED module may include a red LED chip, a green LED chip, and a blue LED chip. The LED module mixes light provided from the plurality of LED chips to output white light.

The LED module may include the green LED chip, the blue LED chip, and a red phosphor. The LED module uses light provided from the plurality of LED chips and the red phosphor to output white light.

The red phosphor may absorb blue light to output red light. However, the red phosphor may absorb a relatively high amount of green light as well as the blue light so that light emitting efficiency of the light source module may be decreased.

SUMMARY

Exemplary embodiments of the present invention provide a light source module having a part of light sources and a phosphor spatially separated from each other to improve light emitting efficiency of the light source module, and a method of manufacturing the light source module.

According to an exemplary embodiment of the present invention, a light source module includes a receiving container, a first light source, a second light source, a first resin, and a second resin. The receiving container includes an upper surface, a first bottom surface, and a second bottom surface. The first bottom surface has a first depth from the upper surface. The second bottom surface has a second depth from the upper surface. The first light source is disposed on the first bottom surface. The first light source generates first color light. The second light source is disposed on the second bottom surface. The second light source generates second color light. The first resin is formed on the first light source. The first resin includes a phosphor emitting third color light. The second resin is formed on the first resin and the second light source.

According to an exemplary embodiment, the first color may be blue. The second color may be green. The third color may be red.

According to an exemplary embodiment, the first depth may be greater than the second depth.

According to an exemplary embodiment, the first and second light sources each may include at least a light emitting diode ("LED") chip.

According to an exemplary embodiment, the first light source may include two blue LED chips. The second light source may include a green LED chip.

According to an exemplary embodiment, a refractive index of the first resin may be equal to or smaller than a refractive index of the second resin.

According to an exemplary embodiment, the first resin may include methyl silicon. The second resin may include phenyl silicon.

According to an exemplary embodiment, the first resin may be formed from a height of the first bottom surface to a height of the second bottom surface.

According to an exemplary embodiment, the second resin may not include a phosphor.

According to an exemplary embodiment, the receiving container may further include a protruded portion. The protruded portion may protrude from the second bottom surface between the first light source and the second light source.

According to an exemplary embodiment, an upper end of the protruded portion may be lower than the upper surface of the receiving container.

According to an exemplary embodiment, the second light source may include a plurality of green LED chips. A predetermined number of the green LED chips may be disposed at a first side with respect to the first light source. A predetermined number of the green LED chips may be disposed at a second side opposite to the first side with respect to the first light source.

According to an exemplary embodiment of the present invention, a method of manufacturing a light source module includes forming a receiving container including an upper surface, a first bottom surface having a first depth from the upper surface, and a second bottom surface having a second depth from the upper surface, disposing a first light source generating first color light on the first bottom surface, disposing a second light source generating second color light on the second bottom surface, dispensing a first resin including a phosphor emitting third color light on the first light source and dispensing a second resin on the first resin and the second light source.

According to an exemplary embodiment, the first color may be blue. The second color may be green. The third color may be red.

According to an exemplary embodiment, the first depth may be greater than the second depth.

According to an exemplary embodiment, the first and second light sources each may include at least an LED chip.

According to an exemplary embodiment, a refractive index of the first resin may be equal to or smaller than a refractive index of the second resin.

According to an exemplary embodiment, the first resin may include methyl silicon. The second resin may include phenyl silicon.

According to an exemplary embodiment, the first resin may be formed from a height of the first bottom surface to a height of the second bottom surface.

According to an exemplary embodiment, the second resin may not include a phosphor.

According to an exemplary embodiment, there is provided a light source module comprising a receiving container, a first light source, a second light source, and a phosphor on the first light source, wherein the first and second light sources are located in the receiving container, and wherein the phosphor is spatially separated from the second light source.

According to the light source module and the method of manufacturing the light source module, a first light source module is disposed on a first height, a second light source module is disposed on a second height, and a first resin is formed on the first light source so that the second light source module may be spatially separated from the first resin. Thus, light emitting efficiency of the light source module may be improved.

BRIEF DESCRIPTION OF THE DRAWINGS

The embodiments of the present invention will become more apparent by describing in detailed exemplary embodiments thereof with reference to the accompanying drawings, in which.

DETAILED DESCRIPTION

Hereinafter, exemplary embodiments of the present invention will be described in further detail with reference to the accompanying drawings, wherein the same reference numerals may be used to denote the same or substantially the same elements throughout the specification and the drawings.

Figure 1:
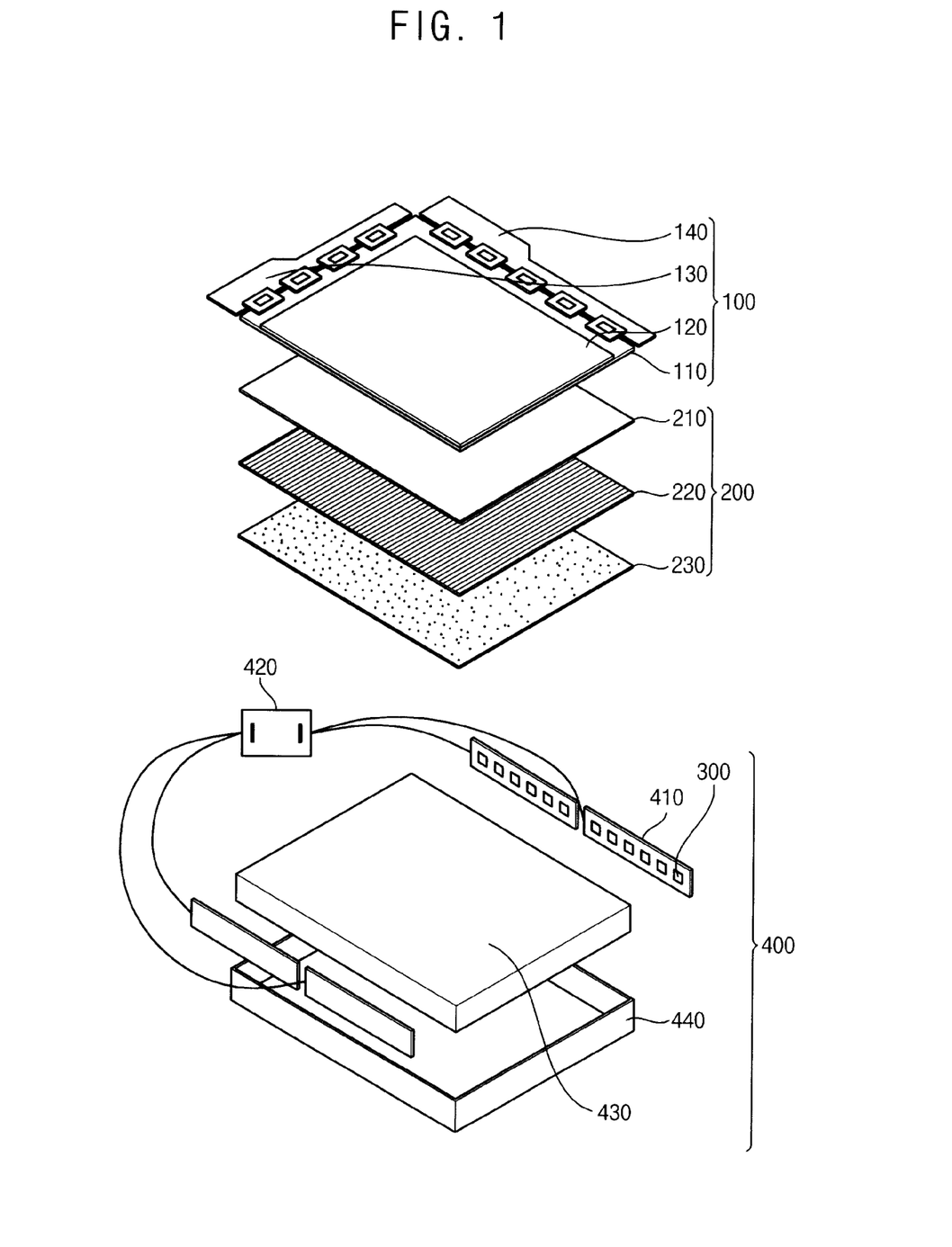
FIG. 1 is an exploded perspective view illustrating a display apparatus according to an exemplary embodiment of the present invention.

FIG. 1 is an exploded perspective view illustrating a display apparatus according to an exemplary embodiment of the present invention.

Referring to FIG. 1, the display apparatus includes a display panel 100, a light adjusting part 200, and a backlight assembly 400.

The display panel 100 displays images. The display panel 100 includes a first substrate 110, a second substrate 120, a liquid crystal layer (not shown in figures), a gate driver 130, and a data driver 140.

The first substrate 110 may be a thin film transistor substrate on which one or more thin film transistor is disposed. The second substrate 120 faces the first substrate 110. The second substrate 120 may be a color filter substrate on which one or more color filters are disposed. The liquid crystal layer (not shown) is disposed between the first and second substrates 110 and 120.

The gate driver 130 and the data driver 140 are connected to the first substrate 110 and output driving signals to the first substrate 110. The drivers 130 and 140 each include a flexible printed circuit ("FPC"), a driving chip mounted on the FPC, and a printed circuit board ("PCB") connected to the FPC.

According to an exemplary embodiment, for example, the display panel 100 may have a rectangular shape that has long sides and short sides as viewed in a plan view. However, the display panel is not limited to the rectangular shape.

The light adjusting part 200 includes a protecting sheet 210, a prism sheet 220, and a diffusion sheet 230.

The protecting sheet 210 protects the prism sheet 220 from damage, such as scratches. According to an embodiment, the prism sheet 220 may include a plurality of prisms disposed at a uniform interval. According to an embodiment, each of the prisms may have a triangular prism cross-sectional shape. The prism sheet 220 allows light diffused by the diffusion sheet 230 to be directed in a direction substantially perpendicular to the display panel 100. The diffusion sheet 230 includes a base substrate and a coating layer disposed on the base substrate. The coating layer may include beads. According to an embodiment, the beads each may have a globular shape. The diffusion sheet 230 diffuses light provided from the backlight assembly for uniform luminance.

According to an embodiment, the light source module 300 may include a plurality of light emitting diode ("LED") chips and a phosphor. The light source module 300 will be described in detail with reference to FIGS. 2 to 4.

The backlight assembly 400 includes a light source part 410, a light source driver 420, a light guide plate 430, and a bottom chassis 440.

The light source part 410 includes a plurality of the light emitting modules 300. The light source part 410 radiates light to the light guide plate 430. Although the light source part 410 is disposed along two long sides of the display panel 100 facing each other as shown in FIG. 1, the embodiments of the present invention are not limited thereto. According to an embodiment, the light source part 410 may be disposed along a single long side of the display panel 100. Alternatively, the light source part 410 may be disposed along two long sides and two short sides of the display panel 100.

The light source driver 420 is electrically connected to the light source part 410 to drive the light source part 410. The light source driver 420 includes a voltage generator (not shown) and a balancing circuit (not shown). The voltage generator generates driving voltages to drive the light source modules 300. The balancing circuit controls currents flowing through the light source modules 300 to have uniform levels.

The light guide plate 430 guides light generated from the light source part 410. According to an embodiment, the light guide plate 430 may have a rectangular shape or a wedge shape in a cross-sectional view.

The bottom chassis 440 is disposed under the light guide plate 430 and receives the display panel 100, the light adjusting part 200, the light source part 410, and the light guide plate 430. According to an embodiment, the light source driver 420 may be disposed outside the bottom chassis 440. According to an embodiment, the light source driver 420 may be disposed under a lower surface of the bottom chassis 440.

Figure 2:
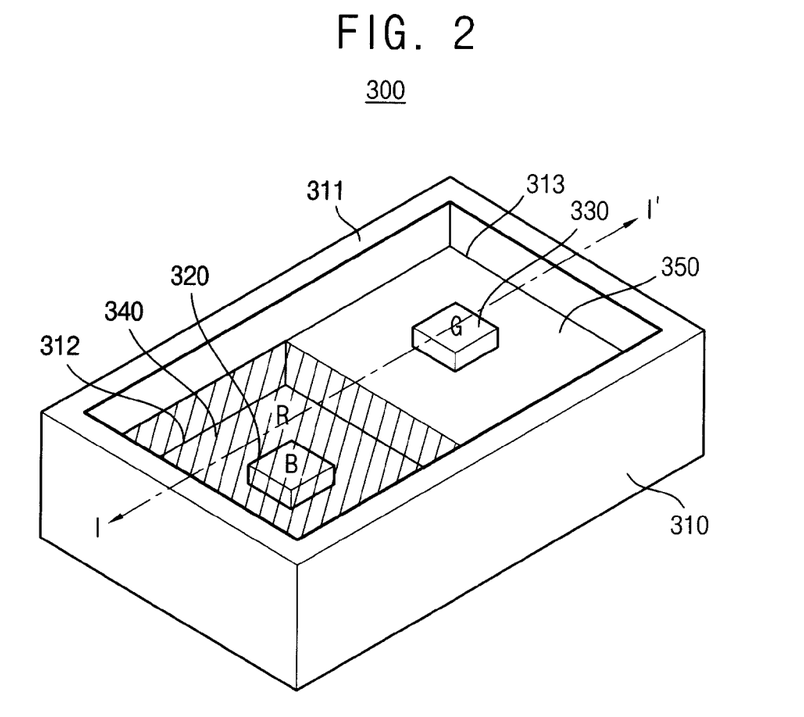
FIG. 2 is a perspective view illustrating the light source module of FIG. 1.
Figure 3:
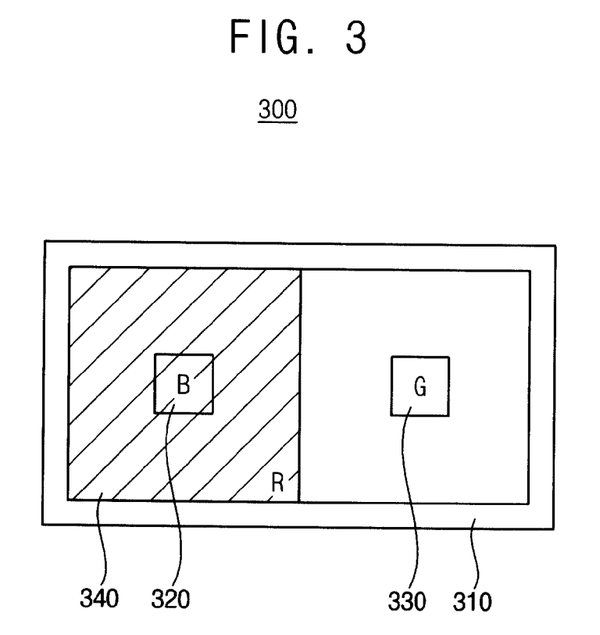
FIG. 3 is a plan view illustrating the light source module of FIG. 1.
Figure 4:
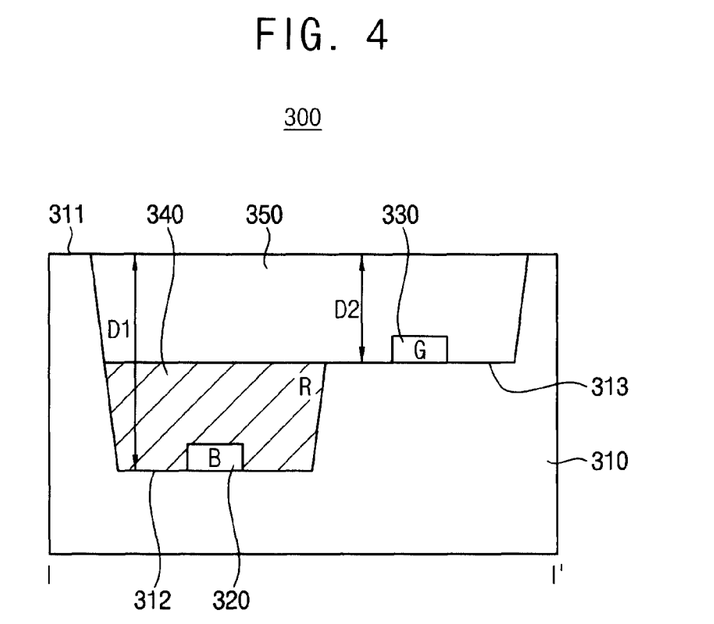
FIG. 4 is a cross-sectional view taken along line I-I' of FIG. 2.

FIG. 2 is a perspective view illustrating the light source module 300 of FIG. 1. FIG. 3 is a plan view illustrating the light source module 300 of FIG. 1. FIG. 4 is a cross-sectional view taken along line I-I' of FIG. 2.

Referring to FIGS. 2 to 4, the light source module 300 includes a receiving container 310, a first light source 320, a second light source 330, a first resin 340, and a second resin 350.

The receiving container 310 includes an upper surface 311, four side surfaces, and a lower surface. For example, the receiving container 310 has a rectangular parallelepiped shape. The receiving container 310 includes a first bottom surface 312 having a first depth D1 from the upper surface 311 and a second bottom surface 313 having a second depth D2 from the upper surface 311. The second depth D2 is different from the first depth D1. For example, the first depth D1 is greater than the second depth D2 as shown in FIG. 4.

For example, according to an embodiment, the receiving container 310 may include a mold resin. According to an embodiment, the receiving container 310 may be formed by injection molding.

According to an embodiment, the upper surface 311 of the receiving container 310 may be a curved surface which has a central portion lower than edge portions. When the upper surface 311 is the curved surface, a contact characteristic between the light source module 300 and the light guide plate 430 may be improved, and a distance between the light source module 300 and the light guide plate 430 may be maintained uniform so that luminance uniformity of the display apparatus may be improved.

Although a first connecting surface connecting the upper surface 311 with the first bottom surface 312 is inclined as shown in FIG. 4, alternatively, the first connecting surface may be substantially perpendicular to the upper surface 311. Although a second connecting surface connecting the first bottom surface 312 with the second bottom surface 313 is inclined as shown in FIG. 4, alternatively, the second connecting surface may be substantially perpendicular to the upper surface 311. Although a third connecting surface connecting the upper surface 311 with the second bottom surface 313 is inclined as shown in FIG. 4, alternatively, the third connecting surface may be substantially perpendicular to the upper surface 311.

The first light source 320 is disposed on the first bottom surface 312. The first light source 320 generates first color light. According to an embodiment, the first color may be blue. For example, according to an embodiment, the first light source 320 may include a blue LED chip. According to an exemplary embodiment, the first light source 320 may include a single blue LED chip.

The second light source 330 is disposed on the second bottom surface 313. The second light source 330 generates second color light. According to an embodiment, the second color may be green. For example, according to an embodiment, the second light source 330 may include a green LED chip. According to an exemplary embodiment, the second light source 330 may include a single green LED chip.

Although not shown in figures, electrodes for driving the first and second light sources 320 and 330 are disposed in the receiving container 310. The first and second light sources 320 and 330 are connected to the electrodes through connecting lines (not shown).

The first resin 340 is formed on the first light source 320. The first resin 340 covers an upper surface and side surfaces of the first light source 320. The first resin 340 may be formed from a height of the first bottom surface 312 to a height of the second bottom surface 313.

The first resin 340 includes the phosphor that represents a third color. According to an embodiment, the third color may be red. According to an embodiment, the red phosphor may be a nitride phosphor or an oxynitride phosphor. Absorption and emission spectra of the red phosphor according to an exemplary embodiment will be described in detail with reference to FIG. 5.

According to an embodiment, the first resin 340 may include methyl silicon, phenyl silicon, and epoxy. According to an embodiment, the first resin 340 may include one of methyl silicon, phenyl silicon, and epoxy. According to an embodiment, a refractive index of the first resin 340 may be between about 1.4 and about 1.6.

The first resin 340 is formed by mixing the red phosphor with methyl silicon, phenyl silicon, and epoxy using a mixer (not shown). The mixed resin is degassed using a degasser (not shown). The degassed resin is dispensed on the first light source 320 using a dispenser (not shown).

The light source module 300 generates white light using the first light source 320, the second light source 330, and the phosphor, and outputs the white light to the light guide plate 430. The first light source 320 generates blue light, a fraction of which passes through the first resin 340 and the remainder of the blue light is absorbed and converted by the red phosphor to red light. The transmitted blue light and the converted red light are mixed to generate magenta light. The second light source 330 generates green light. The magenta light is mixed with the green light to generate white light.

The second resin 350 is formed on the first resin 340 and the second light source 330. The second resin 350 covers an upper surface of the first resin 340 and an upper surface and side surfaces of the second light source 330. The second resin 350 is formed from a height of the second bottom surface 313 to a height of the upper surface 311.

The second resin 350 does not include a phosphor.

According to an embodiment, the second resin 350 may include methyl silicon, phenyl silicon, and epoxy. According to an embodiment, the second resin 350 may include one of methyl silicon, phenyl silicon, and epoxy. According to an embodiment, a refractive index of the second resin 350 may be between about 1.4 and about 1.6.

The second resin 350 is formed by dispensing methyl silicon, phenyl silicon, and epoxy on the first resin 340 and the second light source 330 using a dispenser (not shown).

According to an embodiment, the refractive index of the first resin 340 may be smaller than or equal to the refractive index of the second resin 350.

When the refractive index of the first resin 340 is greater than the refractive index of the second resin 350, green light emitted from the green LED chip 330 toward the first resin 340 via the second resin 350 may easily pass through the first resin 340. As a consequence, the green light from the green LED chip 330 is absorbed by the phosphor in the first resin 340, thus relatively decreasing light emitting efficiency of the light source module 300.

When the refractive index of the first resin 340 is smaller than the refractive index of the second resin 350, green light emitted from the green LED chip 330 toward the first resin 340 via the second resin 350 is less likely to pass through the first resin 340. As a result, the quantity of green light absorbed by the phosphor in the first resin 340 may be decreased. Thus, light emitting efficiency of the light source module 300 may be relatively improved. For example, part of the green light emitted from the green LED chip 330 toward the first resin 340 via the second resin 350 may not penetrate into the first resin 340 due to total reflection at a boundary between the first resin 340 and the second resin 350.

A refractive index of methyl silicon is about 1.4. A refractive index of phenyl silicon is about 1.5. A refractive index of epoxy is about 1.6. For example, according to an embodiment, the first resin 340 may include methyl silicon, and the second resin 350 may include phenyl silicon. For example, according to an embodiment, the first resin 340 may include methyl silicon, and the second resin 350 may include epoxy. Alternatively, any other combinations may also be available. As a result, light emitting efficiency may be further improved.

According to embodiments, the first and second resins 340 and 350 each may include other materials than methyl silicon, phenyl silicon, and epoxy.

Figure 5:
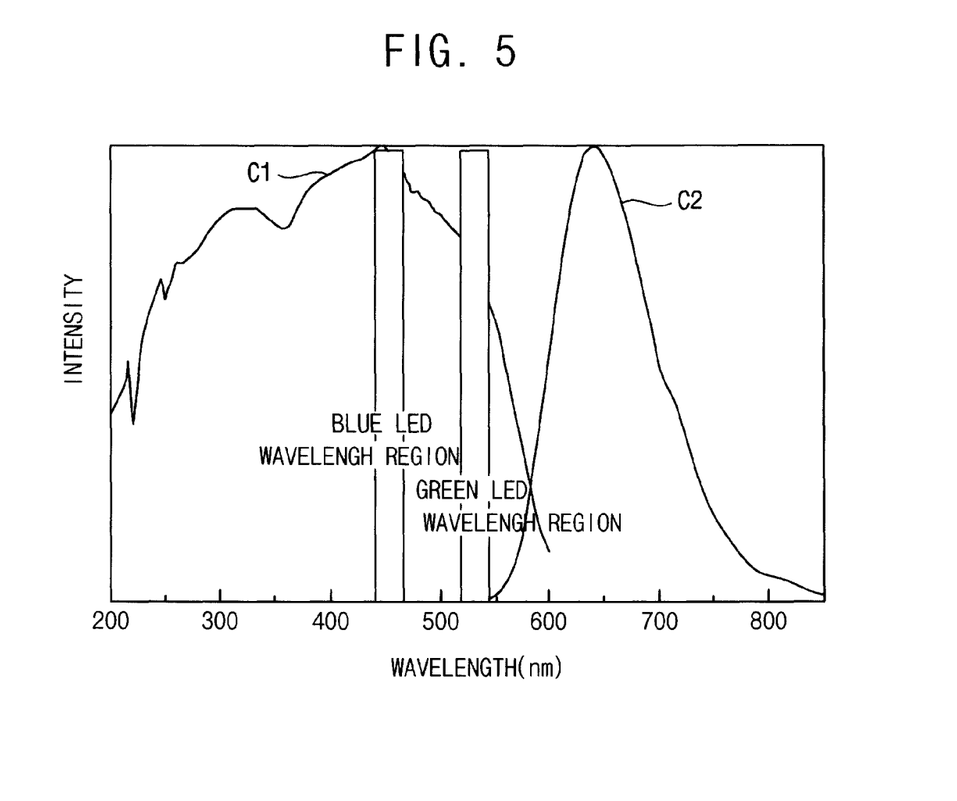
FIG. 5 is a graph illustrating an absorption and emission spectrum of a phosphor of FIG. 2.

FIG. 5 is a graph illustrating absorption and emission spectra of the phosphor of FIG. 2.

Referring to FIG. 5, an absorption curve C1 represents a spectrum of light absorbed by the red phosphor, and an emission curve C2 represents a spectrum of light emitted from the red phosphor.

For example, the red phosphor absorbs light having a wavelength between about 200 nm and about 550 nm to emit light having a wavelength of about 650 nm. The red phosphor exhibits the highest absorption rate with respect to blue light having a wavelength between about 430 nm and about 480 nm. The red phosphor also exhibits a relatively high absorption rate with respect to green light having a wavelength between about 500 nm and about 550 nm. As a result, the red phosphor absorbs blue light and green light to emit red light.

The red phosphor absorbs a relatively high amount of green light as well as the blue light so that light emitting efficiency of the light source module may be decreased. According to an embodiment, the red phosphor and the green LED chip 330 are spatially separated from each other to decrease the amount of green light absorbed by the red phosphor.

According to an exemplary embodiment, the blue LED chip 320 is disposed at the first depth D1 different from the second depth D2 at which the green LED chip 330 is disposed so that the green light is less likely to reach the red phosphor. Accordingly, the quantity of the green light absorbed by the red phosphor may be decreased so that light emitting efficiency of the light source module 300 may be improved. A refractive index of the first resin 340 is smaller than a refractive index of the second resin 350 so that a probability of the green light reaching the red phosphor may be decreased, and thus, light emitting efficiency of the light source module 300 may be further improved.

Figure 6:
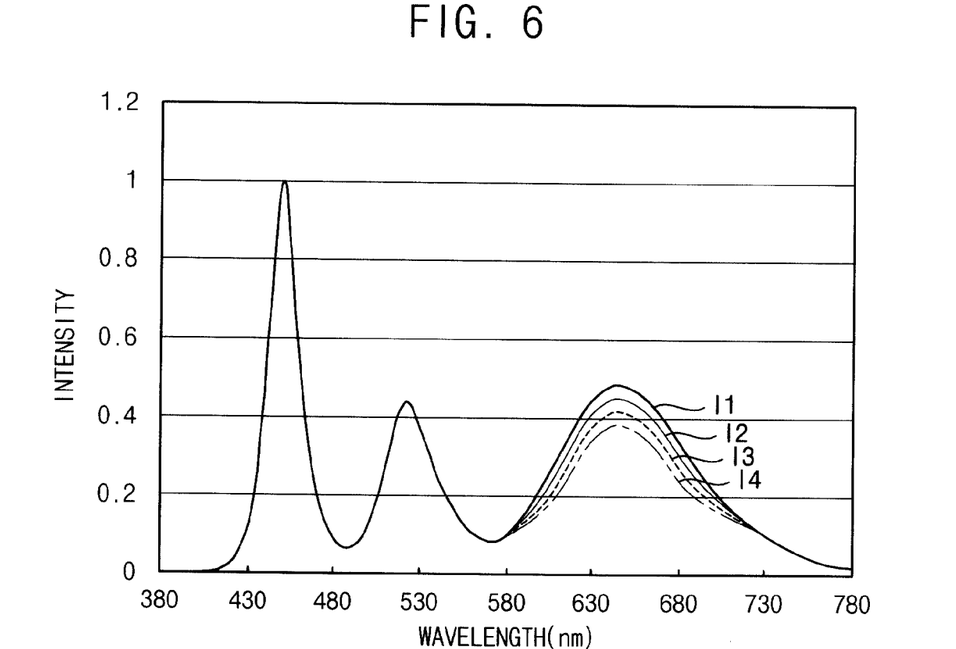
FIG. 6 is a graph illustrating a deterioration of the light source module of FIG. 1.

FIG. 6 is a graph illustrating a deterioration of the light source module 300 of FIG. 1.

Referring to FIG. 6, first to fourth intensity curves I1 to I4 represent changes over time in intensity of blue light generated from the first light source 320, green light generated from the second light source 330, and red light generated from the phosphor.

For example, the first intensity curve I1 represents the intensity of the blue, green, and red light at a first time point. The second intensity curve I2 represents the intensity of the blue, green, and red light at a second time point which is a predetermined time period after the first time point. The third intensity curve I3 represents the intensity of the blue, green, and red light at a third time point which is a predetermined time period after the second time point. The fourth intensity curve I4 represents the intensity of the blue, green, and red light at a fourth time point which is a predetermined time period after the third time point.

Referring to FIG. 6, the first to fourth intensity curves I1 to I4 are normalized by the intensity of blue light so that the first to fourth intensity curves I1 to I4 do not show a difference in the blue light intensity over time within a wavelength range between about 430 nm and about 480 nm, wherein the blue light has the maximum intensity of 1 at a wavelength of about 450 nm.

The first to fourth intensity curves I1 to I4 show little difference over time in the intensity of green light having a wavelength between about 500 nm and about 550 nm. The graph represents that a deterioration speed of the second light source 330 is the same or substantially the same as a deterioration speed of the first light source 320.

The intensity of red light having a wavelength between about 600 nm and about 700 nm is decreased from the first intensity curve I1 to the fourth intensity curve I4 as time passes. The graph represents that the phosphor deteriorates faster than the first light source 320.

According to an exemplary embodiment, the first and second light sources 320 and 330 are disposed in a single package of the same thermal space so that the deterioration speeds of the first and second light sources 320 and 330 are the same or substantially the same. Thus, the light source module 300 may provide reliable color coordinates.

Figure 7:
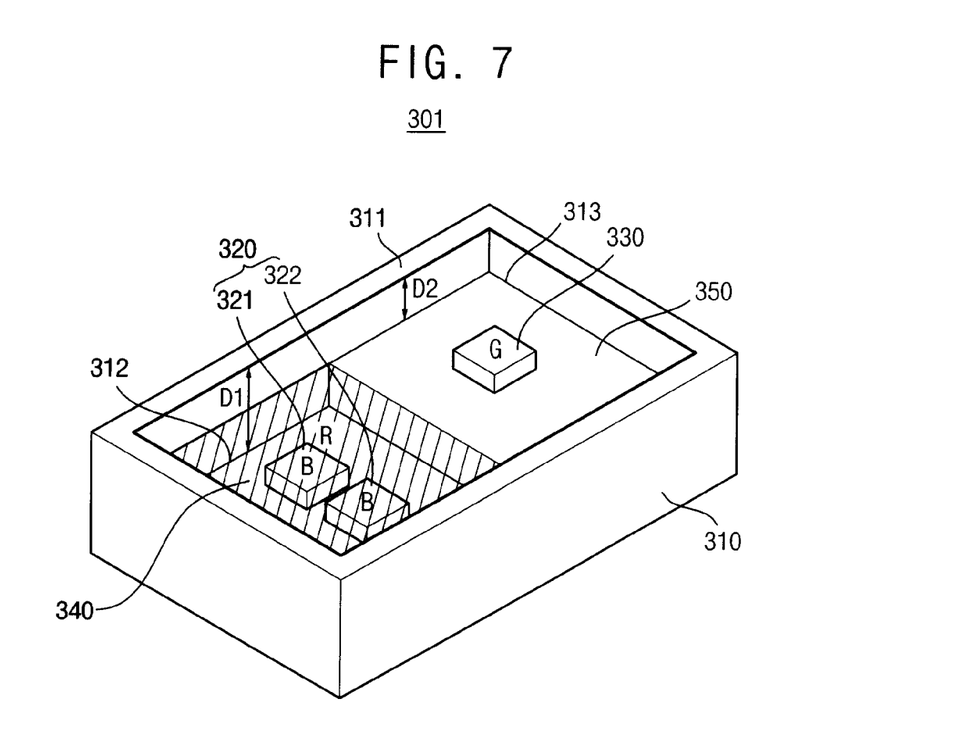
FIG. 7 is a perspective view illustrating a light source module according to an exemplary embodiment of the present invention.
Figure 8:
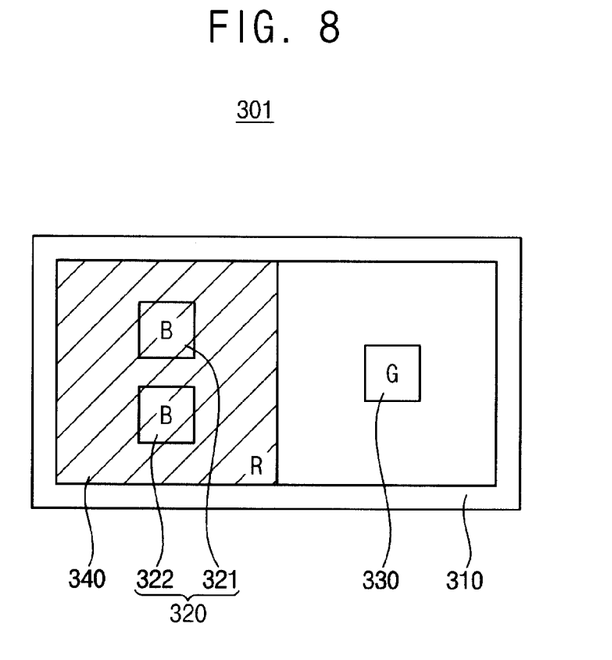
FIG. 8 is a plan view illustrating the light source module of FIG. 7.

FIG. 7 is a perspective view illustrating a light source module according to an embodiment of the present invention. FIG. 8 is a plan view illustrating the light source module of FIG. 7.

The light source module 301 is the same or substantially the same as the light source module 300 described in connection with FIG. 2 except that the first light source 320 includes two blue LED chips 321 and 322.

A method of manufacturing the light source module 301 according to an exemplary embodiment is the same or substantially the same as the method of manufacturing the light source module 300 described in connection with FIG. 2 except for forming two blue LED chips 321 and 322 in the first light source 320.

Referring to FIGS. 7 and 8, the light source module 301 includes a receiving container 310, a first light source 320, a second light source 330, a first resin 340, and a second resin 350.

The receiving container 310 includes an upper surface 311 and a lower surface. The receiving container 310 includes a first bottom surface 312 having a first depth D1 from the upper surface 311 and a second bottom surface 313 having a second depth D2 from the upper surface 311. The second depth D2 is different from the first depth D1. For example, the first depth D1 is greater than the second depth D2.

The first light source 320 is disposed on the first bottom surface 312. The first light source 320 generates first color light. According to an embodiment, the first color may be blue. According to an exemplary embodiment, the first light source 320 includes a first blue LED chip 321 and a second blue LED chip 322.

The second light source 330 is disposed on the second bottom surface 313. The second light source 330 generates second color light. According to an embodiment, the second color may be green. According to an illustrated exemplary embodiment, the second light source 330 may include a single green LED chip.

The first resin 340 is formed on the first light source 320. The first resin 340 covers upper surfaces and side surfaces of the first and second blue LED chips 321 and 322. The first resin 340 is formed from a height of the first bottom surface 312 to a height of the second bottom surface 313.

The first resin 340 includes a phosphor that represents a third color. According to an embodiment, the third color may be red.

The second resin 350 is formed on the first resin 340 and the second light source 330. The second resin 350 covers an upper surface of the first resin 340 and an upper surface and side surfaces of the second light source 330. The second resin 350 is formed from a height of the second bottom surface 313 to a height of the upper surface 311.

The second resin 350 does not include a phosphor.

According to an embodiment, a refractive index of the first resin 340 may be smaller than or equal to a refractive index of the second resin 350.

According to an exemplary embodiment, the second light source 330 is spatially separated from the first resin 340 so that light emitting efficiency of the light source module 301 may be improved. The first and second light sources 320 and 330 are disposed in the same thermal space so that he light source module 301 may provide reliable color coordinates.

The first light source 320 includes the first blue LED chip 321 and the second blue LED chip 322 so that a luminance level of the first light source 320 may be more balanced with a luminance level of the second light source 330. Thus, the light source module 301 may generate more desirable white color.

Although it has been described that the first light source 320 includes two blue LED chips 321 and 322, the first light source 320 may alternatively include three or more blue LED chips. Although it has been described that the second light source 330 includes a single green LED chip, the second light source 330 may alternatively include a plurality of green LED chips.

Figure 9:
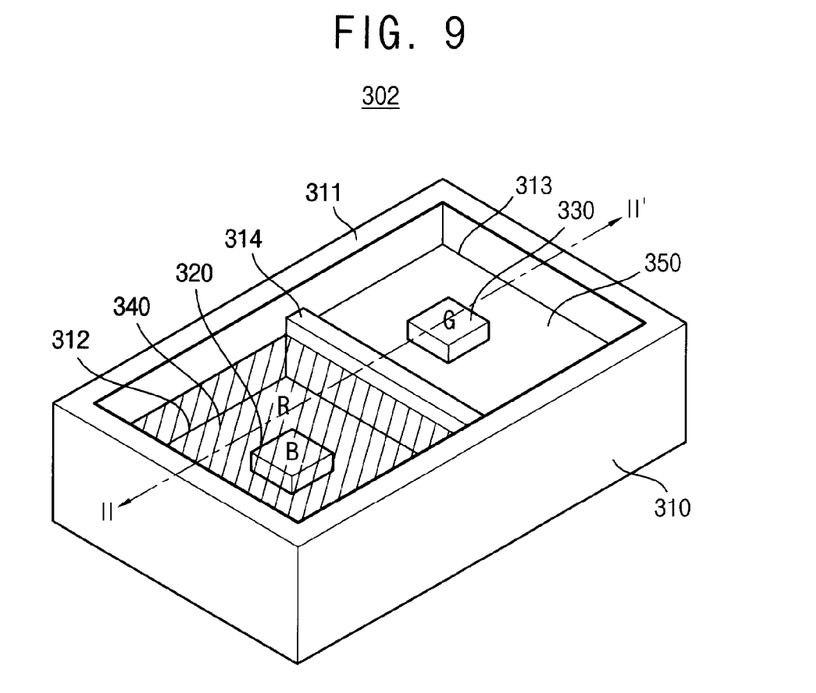
FIG. 9 is a perspective view illustrating a light source module according to an exemplary embodiment of the present invention.
Figure 10:
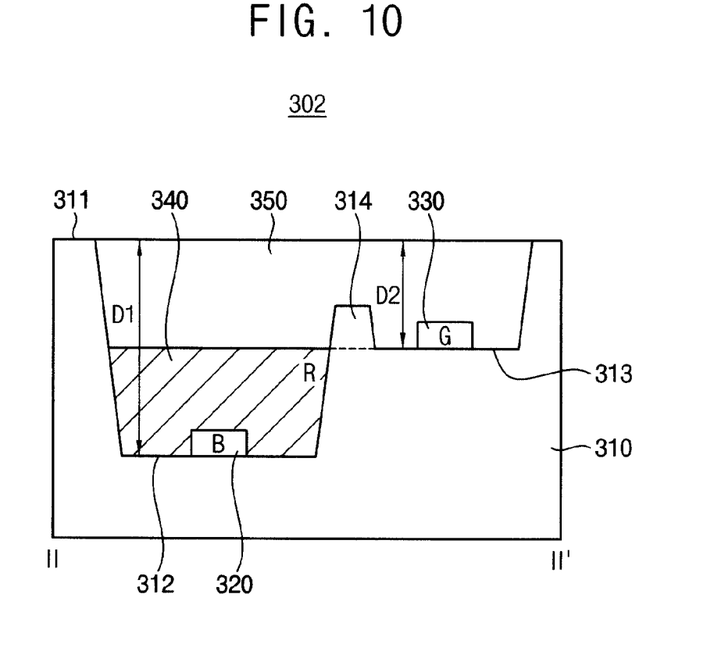
FIG. 10 is a cross-sectional view taken along line II-II' of FIG. 9.

FIG. 9 is a perspective view illustrating a light source module according to an embodiment of the present invention. FIG. 10 is a cross-sectional view taken along line II-II' of FIG. 9.

The light source module 302 is the same or substantially the same as the light source module 300 described in connection with FIG. 2 except that the receiving container 310 further includes a portion 314 that protrudes from the second bottom surface 313.

A method of manufacturing the light source module 302 according to an exemplary embodiment is the same or substantially the same as the method of manufacturing the light source module 300 described in connection with FIG. 2 except for forming the protruded portion 314.

Referring to FIGS. 9 and 10, the light source module 302 includes a receiving container 310, a first light source 320, a second light source 330, a first resin 340, and a second resin 350.

The receiving container 310 includes an upper surface 311 and a lower surface. The receiving container 310 includes a first bottom surface 312 having a first depth D1 from the upper surface 311 and a second bottom surface 313 having a second depth D2 from the upper surface 311. The second depth D2 is different from the first depth D1. For example, the first depth D1 is greater than the second depth D2.

The receiving container 310 further includes the protruded portion 314 that protrudes from the second bottom surface 313. The protruded portion 314 is disposed between the first light source 320 and the second light source 330. An upper end of the protruded portion 314 may be lower than the upper surface 311 of the receiving container 310.

The first light source 320 is disposed on the first bottom surface 312. The first light source 320 generates first color light. According to an embodiment, the first color may be blue. According to an exemplary embodiment, the first light source 320 may include a single blue LED chip.

The second light source 330 is disposed on the second bottom surface 313. The second light source 330 generates second color light. According to an embodiment, the second color may be green. According to an exemplary embodiment, the second light source 330 may include a single green LED chip.

The first resin 340 is formed on the first light source 320. The first resin 340 covers an upper surface and side surfaces of the first light source 320. The first resin 340 is formed from a height of the first bottom surface 312 to a height of the second bottom surface 313. Alternatively, the first resin 340 may be formed from a height of the first bottom surface 312 to a height of the upper end of the protruded portion 314.

The first resin 340 includes a phosphor that represents a third color. According to an embodiment, the third color may be red.

The second resin 350 is formed on the first resin 340 and the second light source 330. The second resin 350 covers an upper surface of the first resin 340 and an upper surface and side surfaces of the second light source 330. The second resin 350 is formed from a height of the second bottom surface 313 to a height of the upper surface 311.

The second resin 350 does not include a phosphor.

According to an embodiment, a refractive index of the first resin 340 may be smaller than or equal to the refractive index of the second resin 350.

According to an exemplary embodiment, the second light source 330 is spatially separated from the first resin 340 so that light emitting efficiency of the light source module 302 may be improved. The first and second light sources 320 and 330 are disposed in the same thermal space so that the light source module 302 may provide reliable color coordinates.

The receiving container 310 includes the protruded portion 314 between the first light source 320 and the second light source 330 so that a probability of green light emitted from the second light source 330 reaching red phosphor in the first resin 340 may be decreased. Accordingly, light emitting efficiency of the light source module 302 may be further improved.

Figure 11:
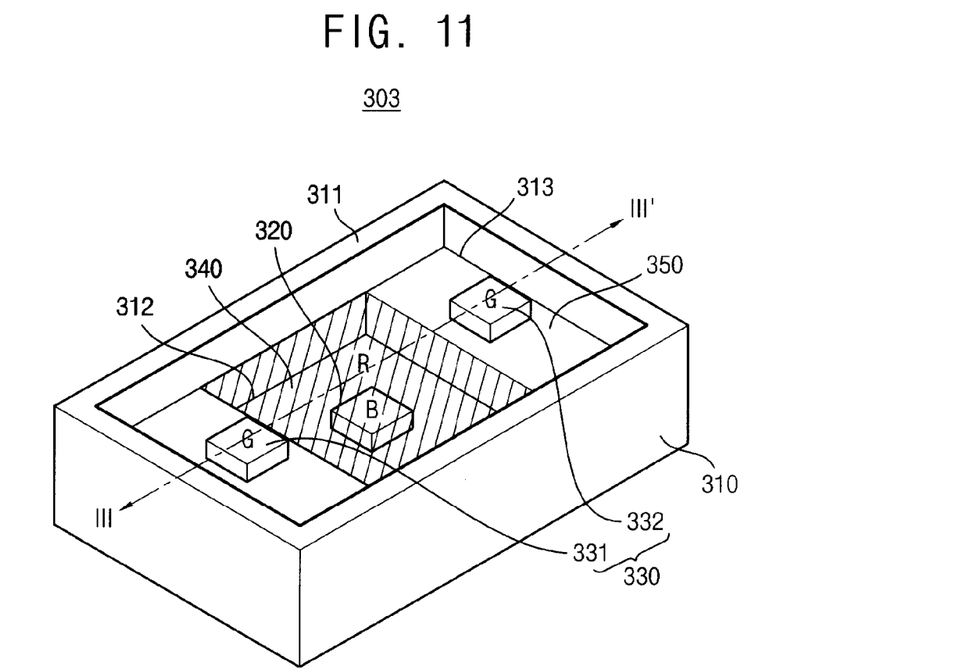
FIG. 11 is a perspective view illustrating a light source module according to an exemplary embodiment of the present invention.
Figure 12:
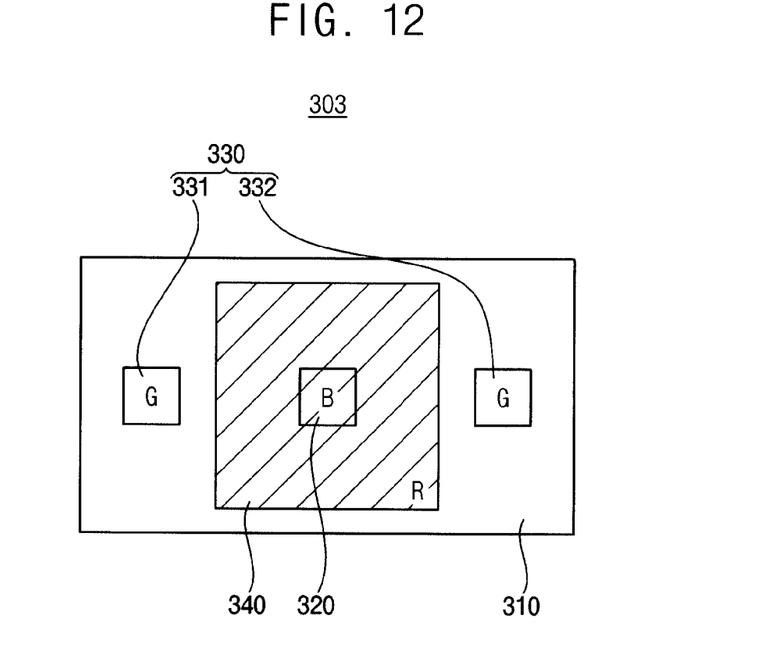
FIG. 12 is a plan view illustrating the light source module of FIG. 11.
Figure 13:
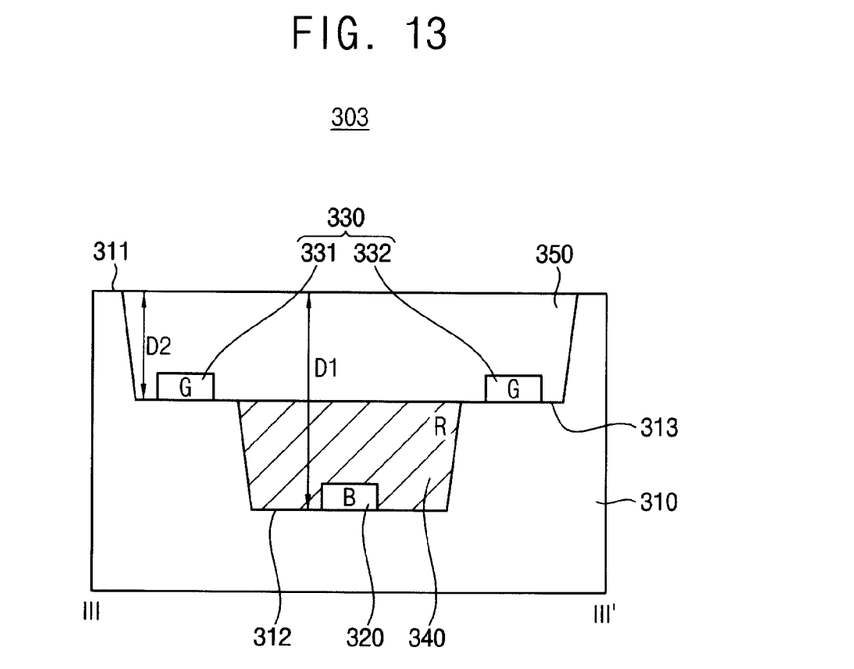
FIG. 13 is a cross-sectional view taken along line III-III' of FIG. 11.

FIG. 11 is a perspective view illustrating a light source module 303 according to an embodiment of the present invention. FIG. 12 is a plan view illustrating the light source module 303 of FIG. 11. FIG. 13 is a cross-sectional view taken along line of FIG. 11.

The light source module 303 is the same or substantially the same as light source module 300 described in connection with FIG. 2 except that the second light source 330 includes a plurality of the green LED chips 331 and 332 that are disposed at first and second sides of the first light source 320, wherein the first and second sides are opposite to each other with respect to the first light source 320.

A method of manufacturing the light source module 303 according to an exemplary embodiment are the same or substantially the same as the method of manufacturing the light source module 300 described in connection with FIG. 2 except for forming the plurality of the green LED chips 331 and 332 at the two sides of the second light source 330.

Referring to FIGS. 11 to 13, the light source module 303 includes a receiving container 310, a first light source 320, a second light source 330, a first resin 340, and a second resin 350.

The receiving container 310 includes an upper surface 311 and a lower surface. The receiving container 310 includes a first bottom surface 312 having a first depth D1 from the upper surface 311 and a second bottom surface 313 having a second depth D2 from the upper surface 311. The second depth D2 is different from the first depth D1. For example, the first depth D1 is greater than the second depth D2 as shown in FIG. 13. The second bottom surface 313 may be disposed at two sides of the first bottom surface 312.

The first light source 320 is disposed on the first bottom surface 312. The first light source 320 generates first color light. According to an embodiment, the first color may be blue. According to an exemplary embodiment, the first light source 320 may include a single blue LED chip.

The second light source 330 is disposed on the second bottom surface 313. The second light source 330 generates second color light. According to an embodiment, the second color may be green. According to an exemplary embodiment, the second light source 330 includes a plurality of green LED chips. For example, the second light source 330 includes first and second green LED chips 331 and 332. The first green LED chip 331 is disposed at a first side of the first light source 320, and the second green LED chip 332 is disposed at a second side of the first light source 320. The second side is opposite to the first side with respect to the first light source 320.

The first resin 340 is formed on the first light source 320. The first resin 340 covers an upper surface and side surfaces of the first light source 320. The first resin 340 is formed from a height of the first bottom surface 312 to a height of the second bottom surface 313.

The first resin 340 includes a phosphor that represents a third color. According to an embodiment, the third color may be red.

The second resin 350 is formed on the first resin 340 and the second light source 330. The second resin 350 covers an upper surface of the first resin 340 and upper surfaces and side surfaces of the first and second green LED chips 331 and 332. The second resin 350 is formed from a height of the second bottom surface 313 to a height of the upper surface 311.

The second resin 350 does not include a phosphor.

According to an embodiment, a refractive index of the first resin 340 may be smaller than or equal to a refractive index of the second resin 350.

According to an exemplary embodiment, the second light source 330 is spatially separated from the first resin 340 so that light emitting efficiency of the light source module 303 may be improved. The first and second light sources 320 and 330 are disposed in the same thermal space so that the light source module 303 may provide reliable color coordinates.

The second light source 330 includes the first and second green LED chips 331 and 332 so that a luminance level of the second light source 330 may be more balanced with a luminance level of the first light source 320. The first and second green LED chips 331 and 332 are disposed at the two sides of the first light source 320 so that a light mixing characteristic of the light source module 303 may be improved. Thus, the light source module 303 may generate more desirable white color.

Figure 14A:
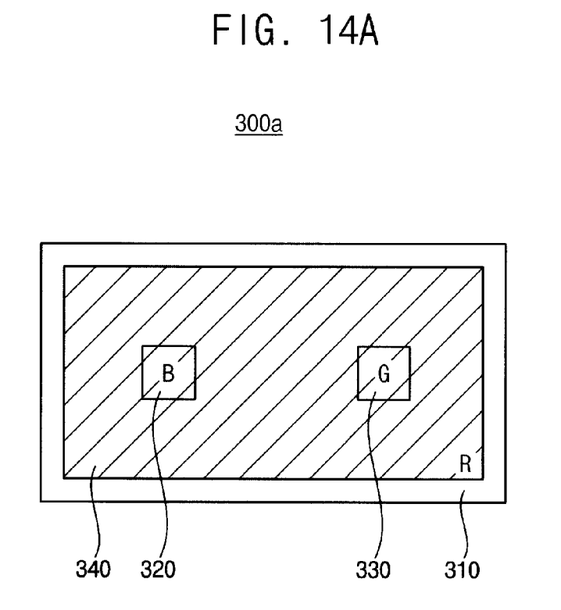
FIG. 14A is a plan view illustrating a light source module according to a first comparative embodiment.
Figure 14B:
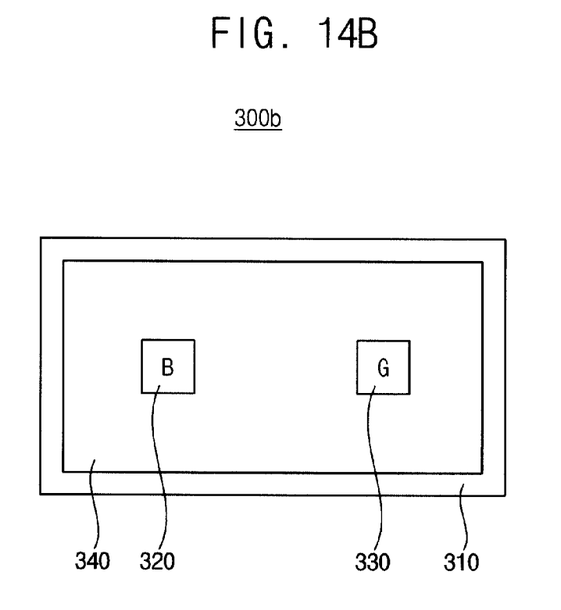
FIG. 14B is a plan view illustrating a light source module according to a second comparative embodiment.
Figure 14C:
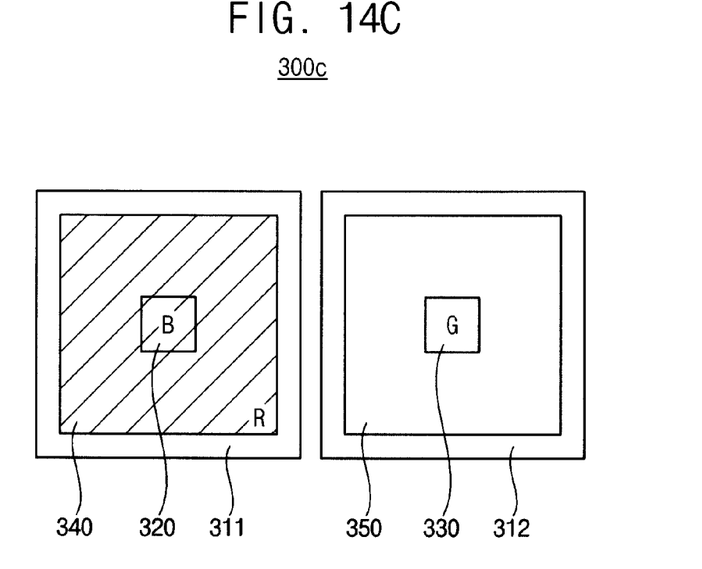
FIG. 14C is a plan view illustrating a light source module according to a third comparative embodiment.

FIG. 14A is a plan view illustrating a light source module 300a according to a first comparative embodiment. FIG. 14B is a plan view illustrating a light source module 300b according to a second comparative embodiment. FIG. 14C is a plan view illustrating a light source module 300c according to a third comparative embodiment.

FIGS. 14A to 14C are provided to comparatively explain to the effects of the light source module 300 described in connection with FIGS. 2 to 4.

Referring to FIG. 14A, the light source module 300a includes a receiving container 310, a first light source 320, a second light source 330, and a first resin 340.

Unlike the receiving container 310 of the light source module 300 that includes the first and second bottom surfaces having different depths, the receiving container 310 are disposed on the same surface.

The first light source 320 includes a blue LED chip that generates blue light, and the second light source 330 includes a green LED chip that generates green light.

The first resin 340 includes a red phosphor. The first resin 340 is formed on the first and second light sources 320 and 330. The first resin 340 covers the first and second light sources 320 and 330. The red phosphor absorbs blue light and green light to emit red light. The light source module 300a does not include a second resin, such as the second resin 350 of the light source module 300.

The light source module 300a mixes blue, green, and red light to output white light.

Referring to FIG. 14B, the light source module 300b includes a receiving container 310, a first light source 320, a second light source 330, and a first resin 340.

The light source module 300b is the same or substantially the same as the light source module 300a according to the first comparative embodiment except that the first resin 340 does not include the phosphor.

The light source module 300b is a light source module obtained by removing the phosphor from the light source module 300a. The light source module 300b does not include a light source or a phosphor to emit red light so that the light source module 300b is unable to display white light.

Referring to FIG. 14C, the light source module 300c includes a first receiving container 311, a second receiving container 312, a first light source 320, a second light source 330, a first resin 340, and a second resin 350.

The first light source 320 is disposed in the first receiving container 311, and the second light source 330 is disposed in the second receiving container 312. The first light source 320 and the second light source 330 respectively include a blue LED chip that generates blue light and a green LED chip that generates green light.

The first resin 340 includes a red phosphor. The first resin 340 is formed on the first light source 320 to cover the first light source 320. The red phosphor absorbs blue light to emit the red light.

The second resin 350 does not include a phosphor. The second resin 340 is formed on the second light source 330 to cover the second light source 330.

The light source module 300a mixes blue, green and red lights to output white light.

Table 1 represents light emitting efficiency of the light source module 300 described in connection with FIGS. 2 to 4 and light emitting efficiency of the light source modules 300a, 300b, and 300c according to the first to third comparative embodiment 1 to 3.

TABLE 1

|  | Luminous flux (lm) | Power consumption (W) | Light emitting efficiency (lm/W) | Light emitting efficiency (%) |
|---|---|---|---|---|
| First comparative embodiment (300a) | 5.745 | 0.226 | 25.38 | 100.00 |
| Second comparative embodiment (300b) | 7.586 | 0.225 | 33.66 | 132.63 |
| Third comparative embodiment (300c) | 8.628 | 0.224 | 38.52 | 151.74 |
| Exemplary embodiment (300) | — | — | 25.38~33.66 | 100.00~132.63 |

The light source module 300a of the first comparative embodiment produced light having a luminous flux of 5.745 lm by consuming 0.226 W. The light emitting efficiency of the light source module 300a was 25.38 lm/W, which was set to 100%.

The light source module 300b of the second comparative embodiment produced light having a luminous flux of 7.586 lm by consuming 0.225 W. The light emitting efficiency of the light source module 300b was 33.66 lm/W corresponding to 132.63% with respect to the light emitting efficiency of the light source module 300a of the first comparative embodiment.

The light source module 300c of the third comparative embodiment produced light having a luminous flux of 8.6281 lm by consuming 0.224 W. The light emitting efficiency of the light source module 300c was 38.521 lm/W corresponding to 151.74% with respect to the light emitting efficiency of the light source module 300a of the first comparative embodiment.

Referring to FIGS. 2 to 4, and FIG. 14A, the light source module 300 includes the second light source 330 and the first resin 340 spatially separated from each other so that the light emitting efficiency of the light source module 300 of the exemplary embodiment of the present invention is higher than the light emitting efficiency of the light source module 300a of the first comparative embodiment.

Referring to FIGS. 2 to 4, and FIG. 14B, the light source module 300b of the second comparative embodiment does not include the phosphor so that the light emitting efficiency of the light source module 300b of the second comparative embodiment is higher than the light emitting efficiency of the light source module 300 of the exemplary embodiment of the present invention. As described above, the light source module 300b does not generate white light so that the light source module 300b is not proper for a display apparatus.

As a result, the light emitting efficiency of the light source module 300 of the exemplary embodiment of the present invention may be between the light emitting efficiency of the light source module 300a of the first comparative embodiment and the light emitting efficiency of the light source module 300b of the second comparative embodiment. For example, the light emitting efficiency of the light source module 300 may be between about 25.38 lm/W and about 33.66 lm/W.

Referring to FIGS. 2 to 4, and FIG. 14C, the light source module 300c of the third comparative embodiment includes the second light source 330 and the first resin 340 completely separated from each other so that the light emitting efficiency of the light source module 300c of the third comparative embodiment is higher than the light emitting efficiency of the light source module 300 of the exemplary embodiment of the present invention.

Figure 15:
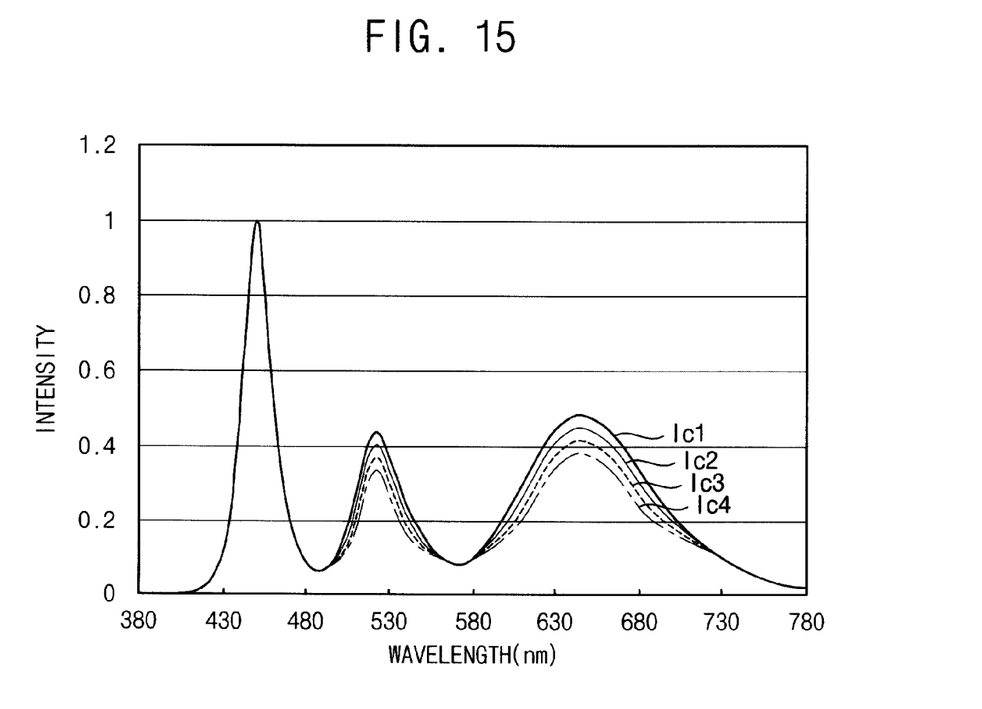
FIG. 15 is a graph illustrating a deterioration of the light source module of FIG. 14C.

FIG. 15 is a graph illustrating a deterioration of the light source module 300c of FIG. 14C.

As shown in FIG. 15, first to fourth intensity curves Ic1 to Ic4 represent time-dependent changes in intensity of blue light generated from the first light source 320, green light generated from the second light source 330, and red light generated from the phosphor.

The first intensity curve Ic1 represents intensities of the blue, green, and red light at a first time. The second intensity curve Ic2 represents intensities of the blue, green, and red light at a second time which is a predetermined time period after the first time. The third intensity curve Ic3 represents intensities of the blue, green, and red light at a third time point which is a predetermined time period after the second time. The fourth intensity curve Ic4 represents intensities of the blue, green, and red light at a fourth time which is a predetermined time period after the third time point.

Referring to FIG. 15, the first to fourth intensity curves Ic1 to Ic4 are normalized by an intensity of the blue light so that the intensity of the blue light having a wavelength between about 430 nm and about 480 nm is not changed over time with the maximum intensity of 1 at about 450 nm.

The intensity of the green light having a wavelength between about 500 nm and about 550 nm decreases from the first intensity curve Ic1 to the fourth intensity curve Ic4 as time goes by. The graph represents that a deterioration of the second light source 330 is faster than a deterioration of the first light source 320. According to an embodiment, the intensity of the green light may increase from the first intensity curve Ic1 to the fourth intensity curve Ic4 as time passes. This represents that a deterioration of the first light source 320 is faster than a deterioration of the second light source 330.

The intensity of the red light having a wavelength between about 600 nm and about 700 nm decreases from the first intensity curve Ic1 to the fourth intensity curve Ic4 as time goes by. The graph represents that a deterioration of the phosphor is faster than a deterioration of the first light source 320.

According to the third comparative embodiment, the first and second light sources 320 and 330 are disposed in independent receiving containers that are independent thermal spaces so that the deterioration speeds of the first and second light sources 320 and 330 may be different from each other. The first light source 320 and the phosphor have optical characteristics different from each other so that the deterioration speeds of the first light source 320 and the phosphor may be different from each other. According to the third comparative embodiment, the first light source 320 generating blue light, the second light source 330 generating green light, and the phosphor generating red light have deterioration speeds different from one another so that the light source module 300a may not provide reliable color coordinates.

The light source module 300c of the third comparative embodiment may have the light emitting efficiency higher than the light emitting efficiency of the light source module 300 of the exemplary embodiment of the present invention. However, the light source module 300c of the third comparative embodiment fail to provide reliable color coordinates so that the light source module 300c may be not proper for a display apparatus.

According to the embodiments of the present invention, the first light source is disposed at a first height, the second light source is disposed at a second height, and the first resin having the phosphor is disposed on the first light source so that the second light source is spatially separated from the first resin. Thus, light emitting efficiency of the light source module 301 may be improved. The refractive index of the first resin is smaller than the refractive index of the second resin so that a probability of green light reaching the red phosphor may be decreased, and thus, the light emitting efficiency of the light source module 300 may be further improved.

Furthermore, the first and second light sources and the phosphor are disposed in the same thermal space so that the light source module may provide reliable color coordinates.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims.

What is claimed is:

1. A light source module comprising:
    a receiving container including an upper surface, a first bottom surface having a first depth from the upper surface and a second bottom surface having a second depth from the upper surface;
    a first light source disposed on the first bottom surface and generating first color light;
    a second light source disposed on the second bottom surface and generating second color light;
    a first resin formed on the first light source and including a phosphor emitting third color light; and
    a second resin formed on the first resin and the second light source, wherein the first color is blue, the second color is green, and the third color is red, and wherein the first light source and the first resin generate magenta light.

2. The light source module of claim 1, wherein the first depth is greater than the second depth.

3. The light source module of claim 2, wherein the first and second light sources each include at least a light emitting diode ("LED") chip.

4. The light source module of claim 3, wherein the first light source includes two blue LED chips, and the second light source includes a green LED chip.

5. The light source module of claim 2, wherein a refractive index of the first resin is equal to or smaller than a refractive index of the second resin.

6. The light source module of claim 5, wherein the first resin includes methyl silicon, and the second resin includes phenyl silicon.

7. The light source module of claim 2, wherein the first resin is formed from a height of the first bottom surface to a height of the second bottom surface.

8. The light source module of claim 2, wherein the second resin does not include a phosphor.

9. The light source module of claim 2, wherein the receiving container further includes a protruded portion protruding from the second bottom surface between the first light source and the second light source.

10. The light source module of claim 9, wherein an upper end of the protruded portion is lower than the upper surface of the receiving container.

11. The light source module of claim 2, wherein the second light source includes a plurality of green light emitting diode ("LED") chips,
    a predetermined number of the green LED chips are disposed at a first side with respect to the first light source, and
    a predetermined number of the green LED chips are disposed at a second side opposite to the first side with respect to the first light source.

12. A method of manufacturing a light source module comprising:
    forming a receiving container including an upper surface, a first bottom surface having a first depth from the upper surface, and a second bottom surface having a second depth from the upper surface;
    disposing a first light source generating first color light on the first bottom surface;
    disposing a second light source generating second color light on the second bottom surface;
    dispensing a first resin including a phosphor emitting third color light on the first light source; and
    dispensing a second resin on the first resin and the second light source, wherein the first color is blue, the second color is green, and the third color is red, and wherein the first light source and the first resin generate magenta light.

13. The method of claim 12, wherein the first depth is greater than the second depth.

14. The method of claim 13, wherein the first and second light sources each include at least a light emitting diode ("LED") chip.

15. The method of claim 13, wherein a refractive index of the first resin is equal to or smaller than a refractive index of the second resin.

16. The method of claim 13, wherein the first resin includes methyl silicon, and the second resin includes phenyl silicon.

17. The method of claim 13, wherein the first resin is formed from a height of the first bottom surface to a height of the second bottom surface.

18. The method of claim 13, wherein the second resin does not include a phosphor.

* * * * *